United States Patent
Hayes et al.

(10) Patent No.: US 9,698,053 B2
(45) Date of Patent: Jul. 4, 2017

(54) LASER LIFTOFF OF EPITAXIAL THIN FILM STRUCTURES

(71) Applicant: The Board of Trustees of the Leland Stanford Junior University, Palo Alto, CA (US)

(72) Inventors: Garrett J. Hayes, Livermore, CA (US); Bruce M. Clemens, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 15/034,984

(22) PCT Filed: Nov. 25, 2014

(86) PCT No.: PCT/US2014/067433
§ 371 (c)(1),
(2) Date: May 6, 2016

(87) PCT Pub. No.: WO2015/077779
PCT Pub. Date: May 28, 2015

(65) Prior Publication Data
US 2016/0293489 A1    Oct. 6, 2016

Related U.S. Application Data

(60) Provisional application No. 61/908,372, filed on Nov. 25, 2013, provisional application No. 62/006,621, (Continued)

(51) Int. Cl.
*H01L 21/78* (2006.01)
*H01L 21/268* (2006.01)
(Continued)

(52) U.S. Cl.
CPC ........ *H01L 21/7813* (2013.01); *H01L 21/268* (2013.01); *H01L 21/6835* (2013.01);
(Continued)

(58) Field of Classification Search
CPC ............................ H01L 21/7813; H01L 21/78
See application file for complete search history.

(56) References Cited

U.S. PATENT DOCUMENTS 7,202,141 B2 * 4/2007 Park ................... B23K 26/0732
257/E21.347
7,528,055 B2   5/2009 Nakahata
(Continued)

OTHER PUBLICATIONS

Wong et al. Damage-free separation of GaN thin films from sapphire, Appl. Phys. Lett. 72 (5), Feb. 2, 1998 pp. 599-601.
(Continued)

*Primary Examiner* — Evren Seven
*Assistant Examiner* — S. M. S Imtiaz
(74) *Attorney, Agent, or Firm* — Lumen Patent Firm (57) ABSTRACT

This work provides a new approach for epitaxial liftoff. Instead of using a sacrificial layer that is selectively etched chemically, the sacrificial layer selectively absorbs light that is not absorbed by other parts of the structure. Under sufficiently intense illumination with such light, the sacrificial layer is mechanically weakened, melted and/or destroyed, thereby enabling epitaxial liftoff. The perimeter of the semiconductor region to be released is defined (partially or completely) by lateral patterning, and the part to be released is also adhered to a support member prior to laser irradiation. The end result is a semiconductor region removed from its substrate and adhered to the support member.

15 Claims, 7 Drawing Sheets

Related U.S. Application Data filed on Jun. 2, 2014, provisional application No. 62/031,055, filed on Jul. 30, 2014.

(51) Int. Cl.
  *H01L 31/18* (2006.01)
  *H01L 33/00* (2010.01)
  *H01L 21/683* (2006.01)

(52) U.S. Cl.
  CPC ...... *H01L 21/7806* (2013.01); *H01L 31/1848* (2013.01); *H01L 31/1892* (2013.01); *H01L 31/1896* (2013.01); *H01L 33/0079* (2013.01); *H01L 2221/68363* (2013.01); *H01L 2221/68381* (2013.01); *Y02E 10/544* (2013.01)

(56) References Cited

U.S. PATENT DOCUMENTS

| | | | |
|---|---|---|---|
| 8,183,589 B2 | 5/2012 | Jeong | |
| 9,159,870 B2 | 10/2015 | You | |
| 2006/0246687 A1* | 11/2006 | Kaiser | H01L 21/268 438/458 |
| 2008/0036065 A1* | 2/2008 | Brunnbauer | H01L 21/568 257/686 |
| 2008/0315901 A1* | 12/2008 | Inoue | G01R 1/06766 324/756.03 |
| 2009/0001604 A1* | 1/2009 | Tanaka | H01L 21/4857 257/778 |
| 2010/0124795 A1* | 5/2010 | Eguchi | H01L 27/1266 438/29 |
| 2011/0204325 A1 | 8/2011 | Kim | |
| 2011/0212577 A1* | 9/2011 | Hebert | H01F 27/292 438/123 |
| 2012/0244683 A1* | 9/2012 | Akagi | H01L 33/0095 438/464 |
| 2014/0061694 A1 | 3/2014 | Leirer | |
| 2014/0073120 A1 | 3/2014 | You | |

OTHER PUBLICATIONS

Ueda et al. Separation of Thin GaN from Sapphire by Laser Lift-Off Technique, Japanese Journal of Applied Physics 50 (2011) 041001-1 to 041001-6.

Udea et al. Laser lift-off of very thin AlGaN film from sapphire using selective decomposition of GaN interlayer, Applied Surface Science 216 (2003) 512-518.

Kelly et al. Optical Process for Liftoff of Group III-nitride films. Physica Status Solidi (A) 159, 1; R3-R4—Applied Research 1997.

Kelly et al. Large Free-Standing GaN Substrates by Hydride Vapor Phase Epitaxy and Laser-Induced Liftoff. Jpn. J. Appl. Phys. vol. 38 (1999) pp. L 217-L 219.

* cited by examiner

LASER LIFTOFF OF EPITAXIAL THIN FILM STRUCTURES

CROSS-REFERENCE TO RELATED APPLICATIONS

This application is a 371 of PCT application PCT/US2014/067433 filed on Nov. 25, 2014.
PCT/US2014/067433 claims the benefit of U.S. Provisional application 61/908,372 filed on Nov. 25, 2013.
PCT/US2014/067433 claims the benefit of U.S. Provisional application 62/006,621 filed on Jun. 2, 2014.
PCT/US2014/067433 claims the benefit of U.S. Provisional application 62/031,055 filed on Jul. 30, 2014.

FIELD OF THE INVENTION

This invention relates to removal of epitaxial layers from a substrate.

BACKGROUND

Conventional semiconductor device fabrication usually entails fabrication of thin film devices on a substrate. Device thicknesses are typically on the order of 1-10 microns, while the substrate thickness is often 500 microns thick. Thus the cost of the substrate can be a significant factor for semiconductor devices. Epitaxial liftoff processes have been considered to alleviate this issue, where a thin layer of material including the fabricated devices is removed from the substrate, thereby enabling reuse of the substrate. For example, a sacrificial layer can be disposed between the device layer and the rest of the substrate. Etching of such a sacrificial layer with an etchant that etches the sacrificial layer but not the substrate or device layers can provide the desired liftoff of the device layers. However, such selective etching can be difficult to carry out in practice. Accordingly, it would be an advance in the art to provide improved epitaxial liftoff.

SUMMARY

This work provides a new approach for epitaxial liftoff. Instead of using a sacrificial layer that is selectively etched chemically, the sacrificial layer selectively absorbs light that is not absorbed by other parts of the structure. Under sufficiently intense illumination with such light, the sacrificial layer is mechanically weakened, melted and/or destroyed, thereby enabling epitaxial liftoff. The perimeter of the semiconductor region to be released is defined (partially or completely) by lateral patterning, and the part to be released is also adhered to a support member prior to laser irradiation. The end result is a semiconductor region removed from its substrate and adhered to the support member.

This approach is applicable to all semiconductor electronic and optoelectronic devices, such as solar cells, light emitting diodes (LEDs), and transistors. Advantages include lower materials cost and faster processing times.

This technology enables the rapid separation of epitaxial materials from a growth substrate and allows for reuse of the growth substrate.

DETAILED DESCRIPTION

Section A of this description considers general principles relating to embodiments of the invention, and section B relates to an experimental example.

A) General Principles

Figure 1A:
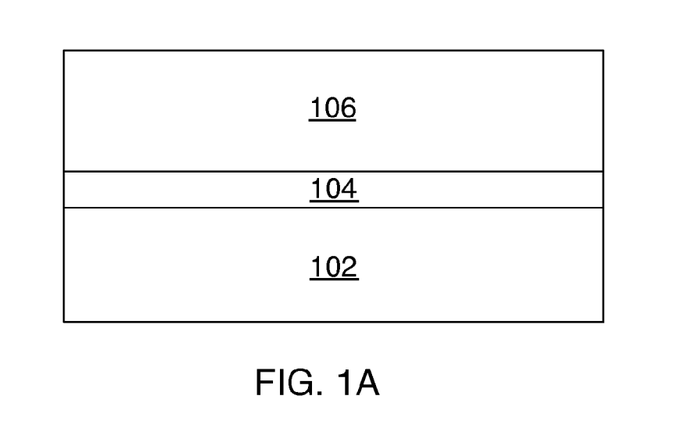
FIGS. 1A-F show an exemplary fabrication sequence according to an embodiment of the invention.
Figure 1B:
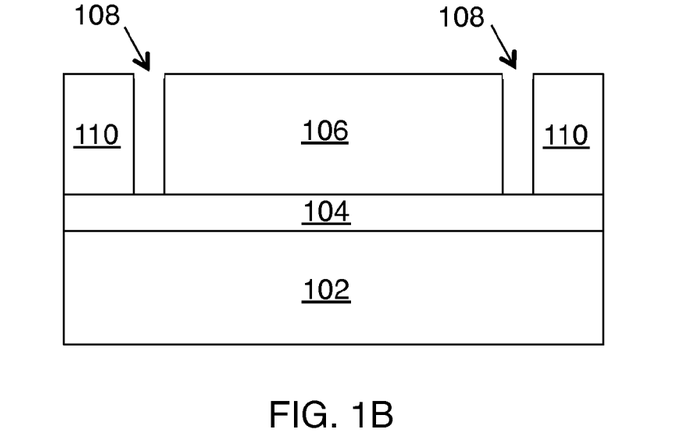
Figure 1C:
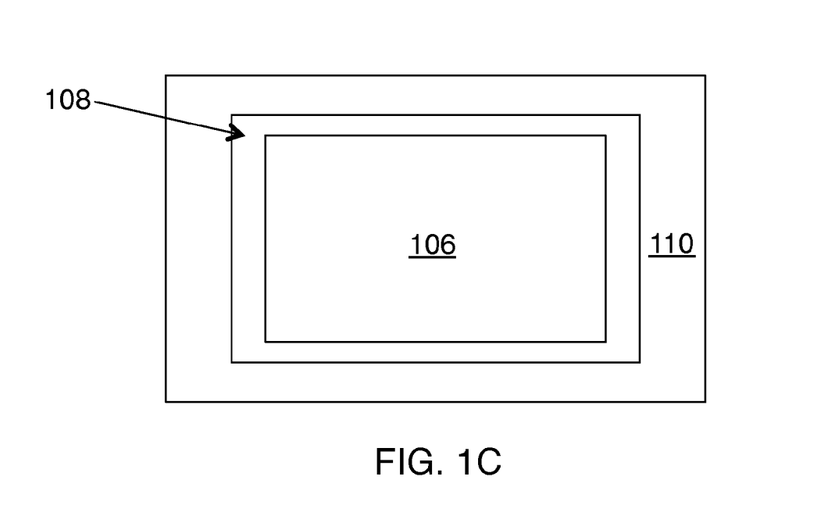
Figure 1D:
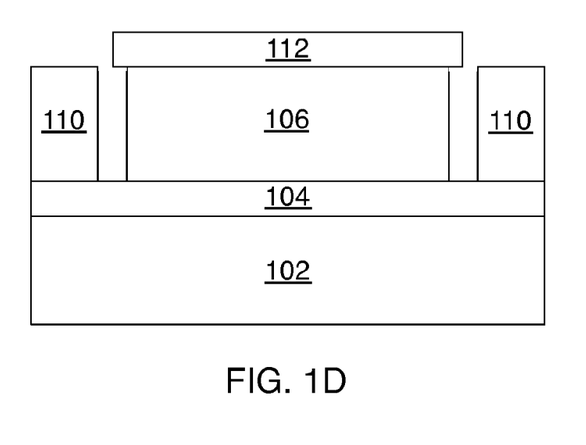
Figure 1E:
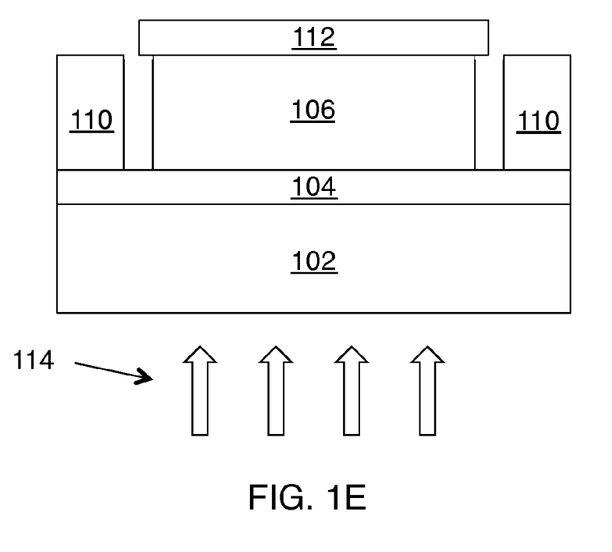
Figure 1F:
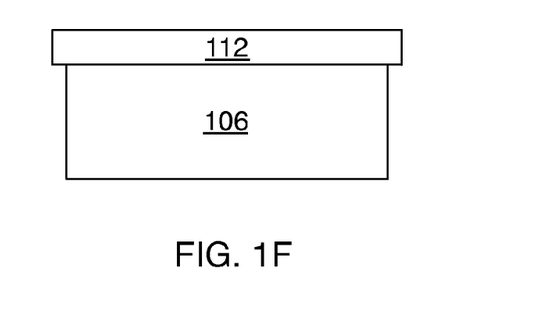

FIGS. 1A-F show an exemplary fabrication sequence according to an embodiment of the invention. FIG. 1A shows a starting point of a substrate 102, a sacrificial layer 104 and a device region 106 that includes one or more semiconductor device layers. FIGS. 1B and 1C show the result of patterning the semiconductor device layers to partially or completely define a release perimeter 108. In this example, the release perimeter is completely defined, as is apparent from the side view of FIG. 1B and the corresponding top view of FIG. 1C. The release perimeter laterally separates the part of the semiconductor device layers to be released (i.e., 106) from the rest of the semiconductor device layers (110). FIG. 1D shows the result of disposing a solid member 112 (e.g., tape) adhered to the semiconductor layers. On FIG. 1E, one or more pulses of laser radiation 114 is provided to the structure. Absorption of the pulses of laser radiation in the sacrificial layer 104 provides ablative release of the semiconductor device layers 106 from the substrate 102. Here ablative release is defined as vaporization of the sacrificial layer in order to release the device layers from the substrate. The pulses of laser energy are selectively absorbed by the sacrificial layer relative to the substrate and/or the semiconductor device layers. Laser radiation 114 can be incident from above or below. FIG. 1F shows the resulting separated structure, where a released part of device region 106 is disposed on solid member 112, and substrate 102 (not shown) is available for re-use.

In a preferred embodiment, the substrate comprises gallium arsenide and the sacrificial layer comprises InGaAsN having a band gap less than 1.43 eV and having a lattice constant of about 565 pm.

Preferably, a single pulse of the laser radiation is used to provide the ablative release of the semiconductor device layers from the substrate. The pulses of laser radiation preferably have a fluence between about 100 mJ/cm$^2$ and about 6 J/cm$^2$. The pulses of laser radiation preferably have a duration between about 0.1 nanosecond and about 1 microsecond. The thickness of the sacrificial layer is preferably between about 1 nm and about 1 μm.

The semiconductor device layers can include one or more layers having the substrate composition. In this way, X on X epitaxial liftoff can be obtained.

Any number of material layers can be placed between the support member 112 and the epitaxial film 106 formed on sacrificial layer 104. These additional layers can include additional epitaxial layers or non-epitaxial layers, and may include an adhesive layer that adheres the support member to the underlying layers. These additional layers can include one or more electronic and optoelectronics devices, such as solar cells, LEDs, and/or transistors and may also include electrically conductive layers. The epitaxial film formed on the sacrificial layer, and any additional layers above the epitaxial film, need not be transparent to the laser light so long as 1) irradiation is performed through the growth substrate, and 2) the sacrificial layer is thick enough to absorb enough of the laser light such that neither the epitaxial film nor the additional layers are significantly damaged by the laser light. For adhesive selection, any number of adhesives will work for this process. Major factors to consider for adhesive selection are temperature stability and stiffness. Silicone adhesives work well for this purpose, but a variety of organic adhesives, as known by those skilled in the art of adhesive selection, could also be appropriate.

Any number of epitaxial layers can be placed between the sacrificial layer and the growth substrate, however these additional epitaxial layers must be largely transparent to the laser light if irradiation is performed through the growth substrate.

The growth substrate 102 itself can include any number of material layers, so long as at least one surface is a template for the epitaxial growth of the sacrificial layer and epitaxial film. These layers may involve layers that help prevent damage to the back surface (side opposite the epitaxial absorber layer) of the growth substrate caused by the laser light. If irradiation is performed through the growth substrate, all of these layers must be largely transparent to the laser light. For passivation purposes, an epitaxial film of a material with a larger bandgap than the growth substrate would help prevent laser light damage to the back surface of the growth substrate. For antireflection purposes, a material with a bandgap larger than that of the growth substrate and that has an index of refraction between that of the growth substrate and that of the media surrounding the back surface of the growth substrate (presumably air), would be useful to reduce the amount of laser light reflected from the back surface of the growth substrate, and maximize the amount of light that reaches the epitaxial absorber layer. Another way to form an antireflection coating is by forming a layer that is equal in thickness to ¼ the wavelength of the laser light used (i.e., thickness=λ/4n, where λ is the wavelength and n is the index of refraction) and has an index of refraction that is as close as possible to the square root of the substrate's refractive index. One who is skilled in the art of optics will be able to select an appropriate antireflection coating for a given substrate and laser light wavelength.

Figure 2A:
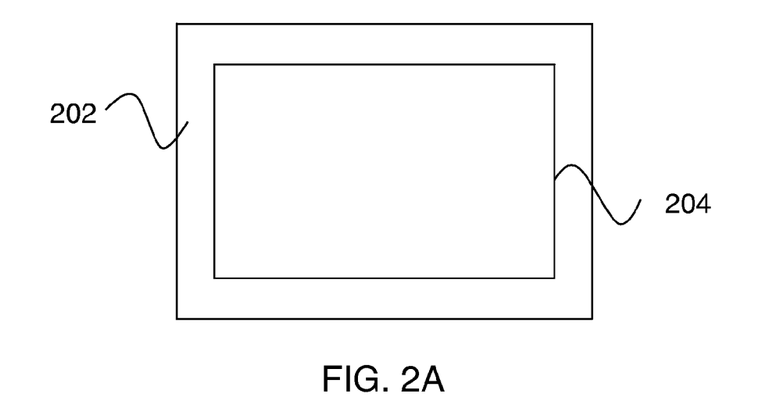
FIGS. 2A-C show several examples of how the release perimeter can be defined.
Figure 2B:
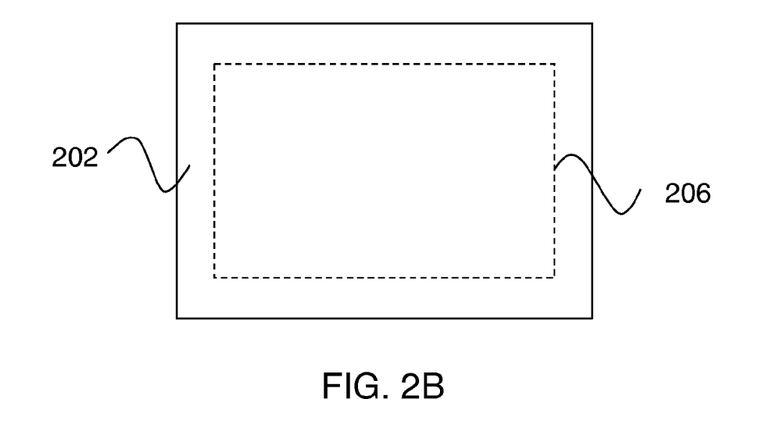
Figure 2C:
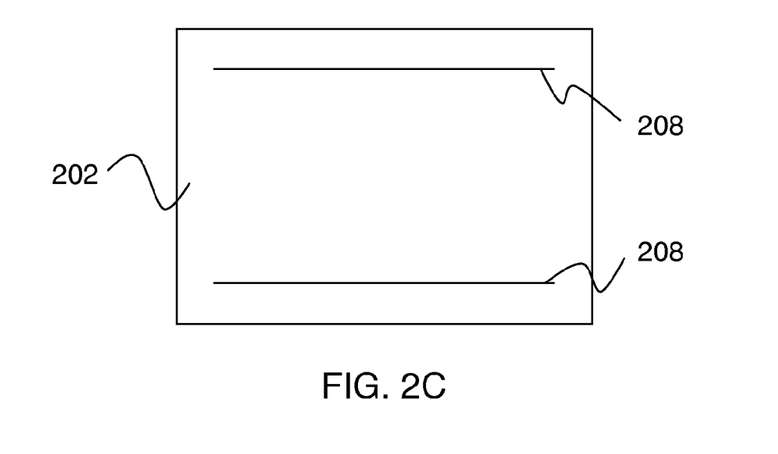

FIGS. 2A-C (all of which are top views) show several examples of how the release perimeter can be defined. Practice of the invention does not depend critically on how the release perimeter is geometrically defined. FIG. 2A schematically shows a completely defined release perimeter 204 in device layers 202. FIG. 2B schematically shows a partially defined release perimeter 206 in device layers 202. FIG. 2C shows another partially defined release perimeter 208 in device layers 202. In this example, the intended release perimeter is a rectangle, and the two longest sides of this rectangle are defined by patterning of device layers 202. In general, it is expected that at least 50% of the intended release perimeter will need to be defined. The patterning used to define the release perimeter may or may not extend through the device layers into the sacrificial layer. This is not expected to be important either way.

Practice of the invention also does not depend critically on the technology used to define the release perimeter in the device layers. Laser ablation, wet etching and/or dry etching can be employed to define the release perimeter. For laser ablation three cases are possible: 1) laser illumination from the top, laser absorbed by the device layers to define the perimeter; 2) laser illumination from the top, laser absorbed by the sacrificial layer to define the perimeter; and 3) laser illumination from the bottom, laser absorbed by the sacrificial layer to define the perimeter.

Figure 3:
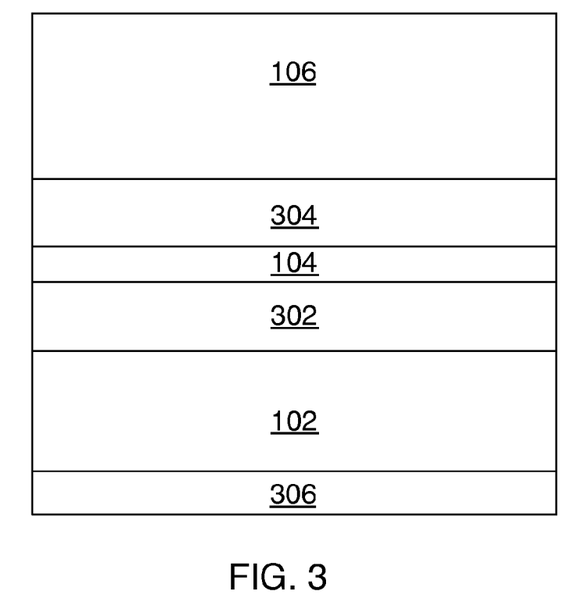
FIG. 3 shows an embodiment with one or more clean-up layers included.

FIG. 3 shows an embodiment with one or more optional clean-up layers included. Such clean-up layers can facilitate further processing after the liftoff, such as further processing of the released device layers and/or re-use of the substrate. Here clean up layer 302 is disposed between substrate 102 and sacrificial layer 104, clean-up layer 304 is disposed between sacrificial layer 104 and device region 106, and clean-up layer 306 is disposed on the bottom of substrate 102. In most cases, the clean-up layers are intended to be easy to completely remove after the laser liftoff process, thereby removing laser-damaged surfaces from the substrate and/or from the released device layers.

By tuning the thickness of the sacrificial layer and the laser fluence, it should be possible to extend the voids left by laser ablation into these clean-up layers, thereby giving the chemical etchant easy access to the etching layers after liftoff, allowing a "plan view" etch rather than a lateral etch. Clean up layers placed in the path of the incoming laser light (upstream of the absorber layer) should have a bandgap greater than the laser photon energy. A variety of etching layer materials could be used for this process.

The considerations for clean-up layer 306 at the bottom of the substrate are somewhat different, since this layer is far away from the sacrificial layer where laser damage is greatest. Sometimes the MOCVD process and other layer deposition processes contaminate the back surface of the substrate with junk material. This is a problem when it comes time to irradiate the structure with the laser because that junk material absorbs the laser light, thereby shadowing the sacrificial layer and often damaging the back substrate surface. We've found that if a protective layer is deposited on the back of a GaAs substrate (e.g., $SiO_2$) before epitaxial layer deposition, then all that junk material deposits on the $SiO_2$ instead of the rear GaAs substrate surface. Once the structure is ready for laser liftoff, the $SiO_2$ layer can be removed, which also removes the junk material adhered to it. This exposes the clean GaAs substrate surface, giving the laser light a clean surface to go through.

In another variation of this technique, the protective layer is left on the substrate during laser liftoff. This can be done in cases where the junk material doesn't tend to stick to $SiO_2$ or similar materials. In yet another variation, two protective layers are used. One layer is permanent, and the other layer is removed before each laser liftoff irradiation. For example, an epitaxial InGaP layer on the back surface can be permanent, and $SiO_2$ layers can be deposited and removed as described above each time a laser liftoff is performed.

One or more of these protective layers can serve as an antireflection coating—reducing the amount of laser light reflected from the substrate bottom surface. In lieu of a protective layer, the back surface of the substrate can simply be cleaned as needed, either chemically or via polishing.

A structure as on FIG. 3 with layers 302 and 304 disposed on both sides of sacrificial layer 104 can be used in cases where lattice matching is needed between the sacrificial layer and other parts of the structure. For example, if an InGaAs sacrificial layer is used on a GaAs substrate, there will be a lattice mismatch. In such a case, layer 302 can have an appropriately graded composition to provide a lattice match. For example, layer 302 could have a composition $In_xGa_{1-x}As$ with x gradually increasing as the layer is grown until it matches the sacrificial absorber layer. Alternatively, layer 302 could have a composition $In_xAl_{1-x}As$ with x gradually increasing as the layer is grown until it lattice matches the sacrificial layer. In either case, layer 304 can be a mirror image of layer 302 to provide lattice matching between layer 104 and device layers 106.

However, it is also possible to have lattice matching throughout the structure, which may be preferable in some cases. InGaAsN can be lattice matched to GaAs, so this is a suitable material for the sacrificial layer. Lattice matched clean-up layers for this example can be made of InGaP.

Figure 4:
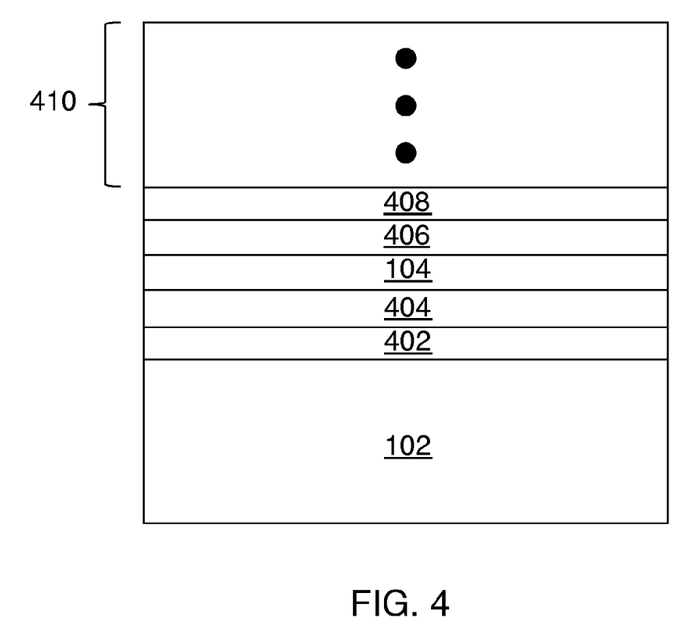
FIG. 4 shows a preferred embodiment for a solar cell application.

FIG. 4 shows a preferred embodiment for a solar cell application. In this example, substrate 102 is GaAs, layers 402 and 408 are $Al_zGa_{1-x}As$ clean-up layers (z>0.4), layers 404 and 406 are GaAs melt buffers, sacrificial layer 104 is $In_xGa_{1-x}N_yAs_{1-y}$ lattice matched to GaAs and having a band gap of less than 1.43 eV, and layers 410 are the solar cell layers.

$In_xGa_{1-x}N_yAs_{1-y}$ sacrificial layer 104 is epitaxially deposited onto a GaAs substrate using MOCVD, where the thickness of the $In_xGa_{1-x}N_yAs_{1-y}$ layer is between 50 nm and 5 microns, preferably between 100 nm and 1 micron, and where the bandgap of this layer will be below 1.43 eV, preferably below 1.16 eV. The composition range of this film would be: 0<x<0.75, and 0<y<0.08, preferably in the range of 0<x<0.4, and 0.01<y<0.05, and more preferably in the range of 0<x<0.2 and 0.01<y<0.04. A hypothetical composition of such a film could be $In_{0.08}Ga_{0.92}N_{0.015}As_{0.985}$. Layers 410 are epitaxially deposited on the $In_xGa_{1-x}N_yAs_{1-y}$ layer, and a glass or plastic support substrate (not shown) is adhered to layers 410 (e.g., similar to FIG. 1D). The laser can be a pulsed Nd:YAG or Nd:glass laser producing 1064 nm radiation in pulses of duration between 1 ns and 100 ns, preferably between 5 ns and 20 ns, with pulse fluences between 100 $mJ/cm^2$ and 8 $J/cm^2$, preferably between 500 $mJ/cm^2$ and 5 J/cm2, and more preferably between 700 $mJ/cm^2$ and 2 $J/cm^2$. Layers 404 and 406 of epitaxial GaAs are placed around sacrificial layer 104 to serve as buffer layers to prevent damage to the growth substrate and thin epitaxial films above the absorber layer upon irradiation. These GaAs layers can be between 50 nm and 2 microns thick each.

Around these GaAs buffer layers are two AlGaAs etching layers. On top of the uppermost AlGaAs etching layer is a GaAs-based solar cell structure (i.e., layers 410) and an electrical contact, where the compositions and thickness of these layers can be optimized for solar cell performance. The total thickness of the epitaxial solar cell layers should be within the range of 2-15 microns.

B) Experimental Demonstration

B1) Introduction

GaAs and related sphalerite III-V materials are attractive for a variety of electronic and optoelectronic devices, however the high cost of III-V substrates hinders their use in certain applications, especially photovoltaics. Separating an epitaxially-grown film from a III-V substrate and recycling the substrate is one means to reduce costs, and today this is achieved by using an acid solution to laterally etch a sacrificial layer placed between the growth substrate and the epitaxial layer(s) of interest. This approach, however, is hindered by long etch times and possible damage to completed devices due to long immersion in etchant solution. We describe here a new approach based on spatially-controlled energy deposition from a pulsed laser.

Unlike existing techniques for separating epitaxial films of wurtzite GaN from c-plane sapphire substrates using laser-assisted GaN decomposition and subsequent Ga melt liftoff, our approach uses spatial control of the band gap to localize laser absorption in a sacrificial layer, achieving one-step ablative liftoff of epitaxial single-crystal sphalerite III-IV films from their substrates. It is orders of magnitude faster than the lateral etching approach, does not require long immersion in etchant solution, and allows release of completed devices. We demonstrate this approach by using a common 1064 nm, nanosecond, Q-switched laser to transfer a single crystal epitaxial GaAs film from its GaAs growth substrate to a flexible polymer substrate. Furthermore, we show that this transferred GaAs layer is indistinguishable in structural quality from its single crystal GaAs growth substrate.

Our approach achieves liftoff in a single step by causing ablation of a buried light-absorbing layer. This is in contrast to the GaN/sapphire laser liftoff approach, a two step approach which uses an ultraviolet laser to dissociate GaN along the heterointerface to form a low melting point Ga-rich layer that is subsequently heated and melted, allowing the remaining GaN to be mechanically removed from the sapphire. To achieve single step liftoff with our approach, we deposit a thin, pseudomorphic layer of InGaAsN onto a GaAs substrate, followed by the deposition of the epitaxial GaAs film—which, due to the absence of misfit dislocations in the InGaAsN layer, is of exceptionally high structural quality. We then adhere a flexible polymer substrate to the GaAs film surface before exposing the structure to a single laser pulse directed through the GaAs substrate. By tuning the composition of the InGaAsN layer such that its bandgap is lower than 1.165 eV (energy of a 1064 nm photon), the InGaAsN layer strongly absorbs 1064 nm laser light to which the GaAs substrate is effectively transparent. Upon absorption of the laser pulse, ablation occurs along the InGaAsN layer, separating the GaAs film from its GaAs growth substrate, producing a crack-free GaAs layer adhered to a flexible polymer substrate.

Using grazing incidence X-ray diffraction (XRD), we show that the as-grown epitaxial GaAs film is indistinguishable in structural quality to its GaAs growth substrate. Then, using cross sectional transmission electron microscopy (TEM), we show that the InGaAsN and GaAs layers contain no detectable quantity of dislocations before liftoff; and, that no detectable quantity of dislocations are introduced into the GaAs film as a result of laser liftoff. Lastly, we provide preliminary data on a simple, inexpensive chemical etching procedure designed to restore the GaAs growth substrate for reuse. Our results strongly suggest that with optimization of process parameters, our laser liftoff technique can be used to rapidly transfer large area sphalerite III-V films—as well as completed devices—from their III-V growth substrates to flexible substrates; and, that their growth substrates can be reused.

B2) Results

Using metallorganic chemical vapor deposition (MOCVD), a 190 nm thick InGaAsN layer was deposited onto a 500 μm thick <001> GaAs substrate, followed by the deposition of a 2.25 μm thick GaAs layer (see Methods section). From photoluminescence data of this structure, as well as an X-ray diffraction (XRD) reciprocal space map of the InGaAsN and GaAs (115) peaks of this sample, the composition of the InGaAsN layer was approximated to be $In_{0.09}Ga_{0.91}As_{0.962}N_{0.038}$.

Figure 5:
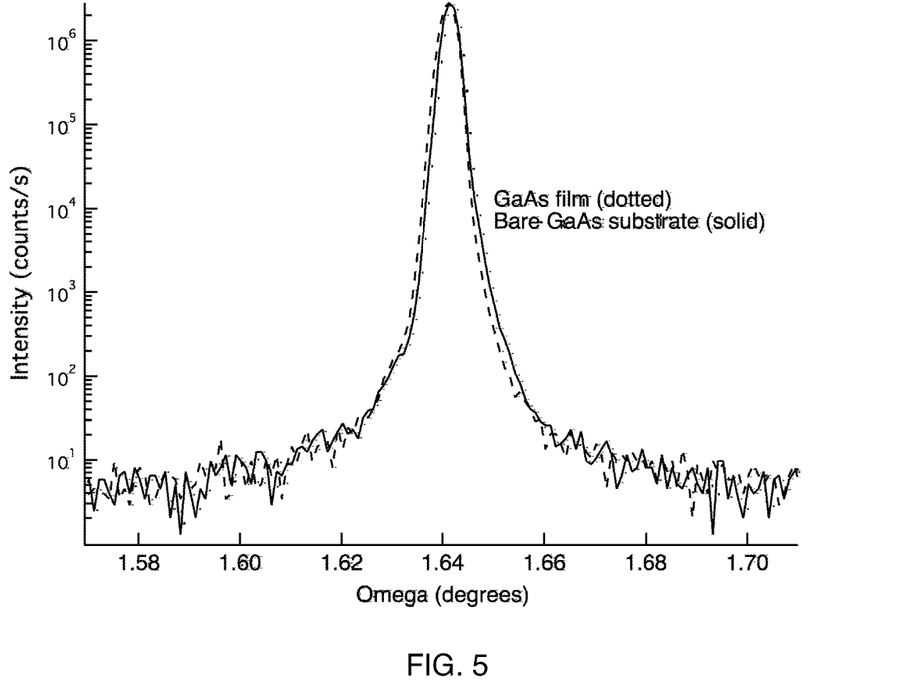
FIG. 5 is an X-ray diffraction rocking curve for the experiments of section B.

To determine the structural quality of the GaAs film before liftoff, a grazing incidence reciprocal space map was taken of the GaAs film (113) peak, and was compared to an identical measurement taken on a bare GaAs substrate sawn from the same ingot as the growth substrate. From these reciprocal space maps, the rocking curves shown in FIG. 5 were extracted. From FIG. 5, we see that the two GaAs (113) rocking curves nearly overlap, each having a FWHM of 0.003° in ω, showing that the epitaxial GaAs film is indistinguishable in structural quality to the bare GaAs single crystal substrate.

Figure 7:
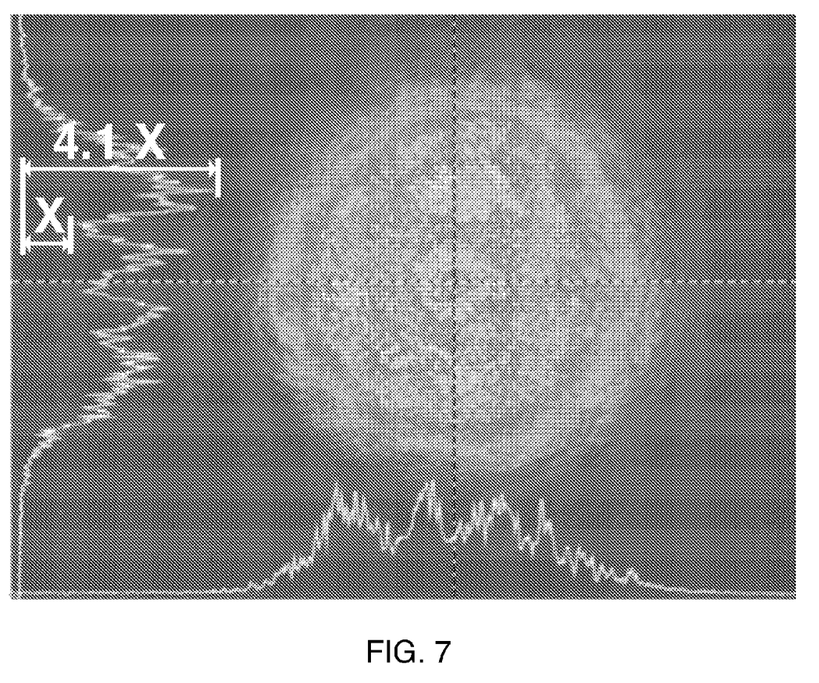
FIG. 7 shows measured laser beam profile for the experiments of section B.

Sections of GaAs film were transferred to 3M Scotch Magic Tape (cellulose acetate film with an acrylate adhesive) using the process described above in connection with FIGS. 1A-F using a Q-switched Nd:YAG laser with a pulse duration FWHM of 8-9 ns. A fluence profile of this beam is shown in FIG. 7. It is worth pointing out that large area, crack free layers of GaAs can be transferred despite the highly inhomogeneous laser beam. Liftoff was achieved over a large range of average fluences from 650 mJ/cm$^2$ to 3.5 J/cm$^2$, although, when average fluences greater than ~1.5 J/cm$^2$ were used, the back surface of the GaAs substrate was damaged where the high fluence regions of the beam impinged on the substrate. Average fluence values were calculated by measuring the total pulse energy with a pyroelectric energy detector, and dividing this value by the cross sectional area of the entire beam, which was calculated by measuring the diameter of the beam's burn paper pattern.

Figure 8A:
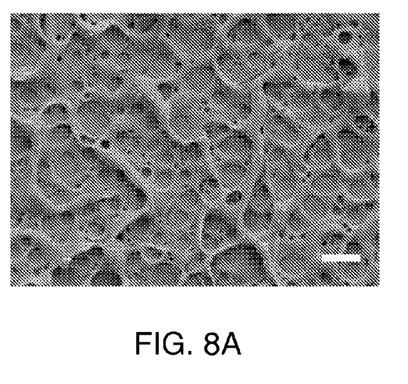
FIGS. 8A-B show scanning electron microscope (SEM) micrographs of the separation surfaces of the released device layers and of the substrate after liftoff.
Figure 8B:
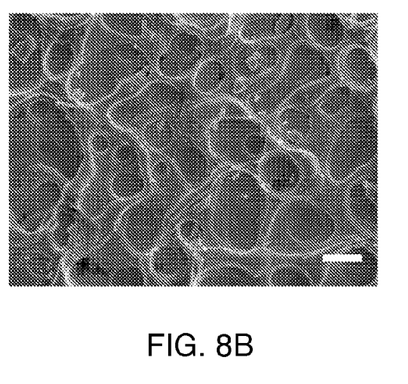

In one experiment, a 2 mm×3.4 mm section of GaAs film was transferred to Scotch tape. For this sample, a 6.4 mm diameter beam with an average fluence of 750 mJ/cm$^2$ was used—a fluence well below the threshold at which the back surface of the GaAs substrate is damaged. Careful inspection of the GaAs film revealed that it was completely free of cracks or pinholes. The newly exposed surfaces of the GaAs film, and of the substrate, are roughened due to a thin layer of material that appears to have melted and resolidified, producing surface features typically hundreds of nanometers tall. Scanning electron micrographs of these features are shown in FIGS. 8A and 8B. Here FIG. 8A shows the released film, FIG. 8B shows the substrate and the scale bars are 2 μm. Currently, 2 mm×3.4 mm is about the largest area of film we can transfer using our inhomogeneous laser beam, as it is the largest area that can be irradiated with no portion of the beam below the fluence threshold at which liftoff occurs. To transfer larger areas, a higher energy laser, ideally one with greater beam homogeneity, should be employed.

Figure 6A:
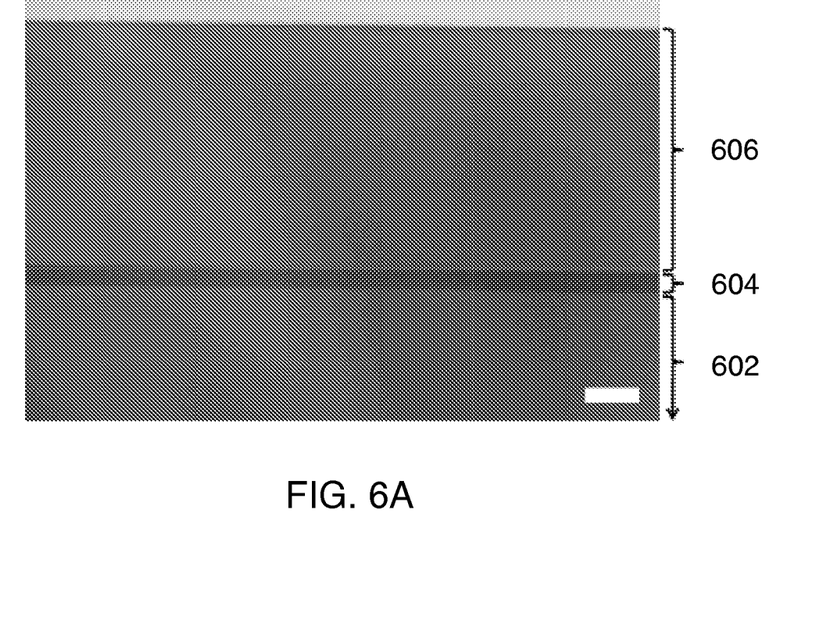
FIGS. 6A-B show transmission electron microscope (TEM) cross sections of a sample before and after liftoff.
Figure 6B:
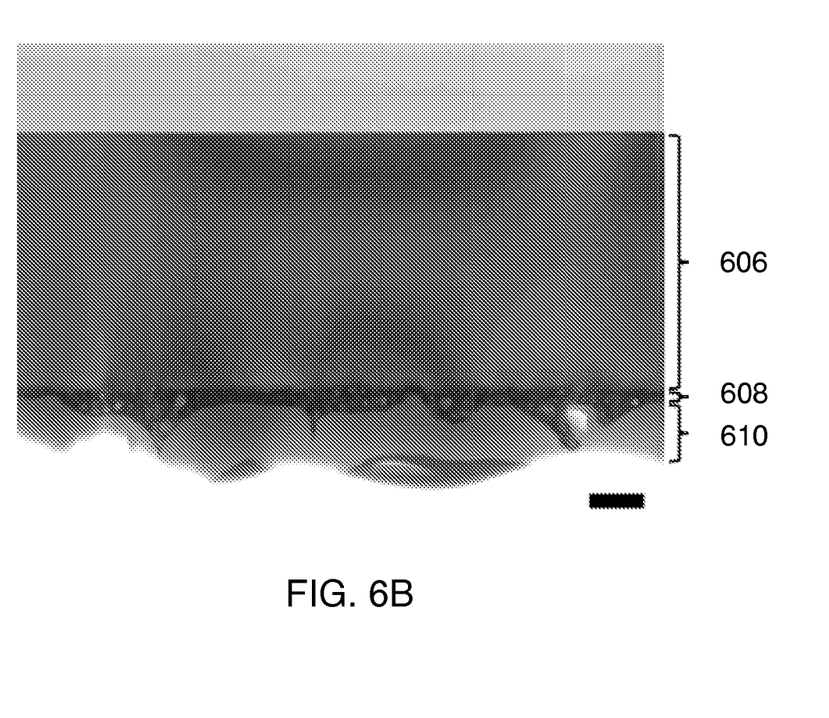

Bright-field cross sectional TEM images of the as-grown structure, and of the post-liftoff GaAs film, are shown in FIGS. 6A and 6B. Here FIG. 6A shows the as-grown structure, FIG. 6B shows the post-liftoff GaAs film, and the scale bars are 500 nm. More specifically, 606 is the GaAs film, 604 is the InGaAsN sacrificial layer, 602 is the GaAs substrate, 608 is resolidified material, and 610 is TEM mounting adhesive. Both cross sections were prepared via ion milling in a dual beam focused ion beam/scanning electron microscope (FIB/SEM), as described in the Methods section. Both TEM images were taken with a beam voltage of 200 kV at an angle slightly off a <110>-type zone axis. The broad intensity variations seen in FIGS. 6A-B are bend contours, and the vertical streaks in FIG. 6B are curtaining artifacts from the FIB sample preparation process caused by the irregular surface features in the resolidified melt region. In FIG. 6B we see that the melted region does not penetrate deeply into the GaAs layer, which maintains a nominal thickness of 2.25 μm. During TEM analysis, no dislocations were observed in either the GaAs or InGaAsN layers in the as-grown structure, nor were they observed in the post-liftoff GaAs film. Multiple regions of each TEM sample were viewed at various magnifications and degrees of sample tilt, and no dislocations were detected in either sample. The absence of dislocations in the as-grown TEM sample is consistent with the narrow XRD rocking curve of the as-grown GaAs (113) film peak; and, the absence of dislocations in the post-liftoff GaAs sample shows that the laser liftoff process does not introduce a detectable quantity of dislocations into the GaAs layer.

In order to reuse the GaAs substrate, the GaAs wafer surface must be restored to an epi-ready condition after the laser liftoff process. In an attempt to facilitate this, a structure similar to the <001>GaAs substrate/InGaAsN (190 nm)/GaAs (2.25 μm) structure was grown, but with the addition of a ~1 ∥m thick lattice-matched InGaP layer placed between the GaAs substrate and the InGaAsN layer. The InGaP layer was used because phosphide materials are readily etched by hydrochloric acid (HCl), which is an acid that does not etch arsenide materials, making the InGaP layer a selective sacrificial etching layer. Furthermore, InGaP has a bandgap greater than 1.17 eV, making it transparent to 1064 nm photons. After removal of the GaAs layer via laser liftoff, the GaAs substrate surface was rough. The substrate was then immersed in 12.1 M HCl for approximately 5 minutes. Upon removal from HCl, the substrate surface was markedly smoother, but was visibly coated with debris. The substrate was then immersed in acetone and scrubbed with a cotton swab, which removed nearly all of this debris, resulting in a mirror-like surface. It is likely that this debris is comprised of residual InGaAsN material, which due to its very low N content, is essentially an arsenide, and is thus expected to behave chemically as an arsenide and resist etching by HCl. The rough morphology of the post-liftoff substrate, as well as the speed at which the InGaP layer was etched, suggest that this residual InGaAsN layer is holey, which allowed the HCl easy access to the underlying InGaP layer, which upon etching, deposited the insoluble InGaAsN material onto the GaAs wafer surface.

Though most of the debris was cleared by scrubbing the substrate in acetone, the presence of insoluble particles in the etchant solution could be an obstacle for preparing a surface for epitaxial growth. Ideally, the particles would be prevented from forming in the first place. To do that, a multi-part chemical etch could be employed, which is the subject of a future study. With a multi-part etch, the residual InGaAsN could be etched with an arsenide-specific etchant such as $C_6H_8O_7$:$H_2O_2$:$H_2O$, with the InGaP layer serving as an etch stop. Next, the InGaP layer could be etched with a phosphide-specific etchant such as HCl, with the GaAs substrate serving as an etch stop. The same scheme could also be employed to the GaAs film by placing a second InGaP layer between the InGaAsN layer and the GaAs film, which would result in a high quality GaAs film surface that would allow for additional processing of the GaAs film after liftoff, if desired. Since these steps are not lateral etches, they would be fast, meaning the samples would spend very little time in the etchant solutions, which would help prevent damage to other device layers caused by the etchant solution.

The results presented herein raise new fundamental materials science questions. The atomic-scale mechanisms underlying our process are still unknown and are relatively unexplored at this time. From a fundamental perspective, there is no atomic-level understanding of the structural processes that occur when a buried single crystal layer is selectively superheated on short time-scales. A number of questions arise: How does the structure of the buried, coherently-strained InGaAsN layer evolve as it is superheated above its melting point in a confined geometry? Furthermore, without a free surface to nucleate the liquid phase, what is the nature of this phase transition and how fast does it evolve? Answering these questions will not only provide useful insight for the optimization of our laser liftoff process, but may also dramatically expand our understanding of some of the most fundamental concepts in materials science.

In summary, our laser liftoff approach provides a new means for transferring high quality single crystal sphalerite III-V films from their growth substrate to a flexible polymer substrate with no deterioration in crystalline quality of the layers during transfer. Our approach provides a new pathway for creating flexible III-V devices that overcomes the major challenges faced by the lateral etching approach. With increased options in choosing other device layers, flexible multilayer III-V devices, including flexible multijunction solar cells, may someday become a reality using this process. Using a liftoff fluence of 750 mJ/cm$^2$, a commercially available 10 J Nd:YAG nanosecond pulsed laser would provide enough energy to separate over 13 cm$^2$ of film in a single pulse—a sufficiently large area for a practical solar cell. By syncing multiple lasers to create a single large pulse, even larger areas of film could be separated.

B3) Methods

Using MOCVD, the 190 nm thick InGaAsN layer was deposited at 520° C. and 100 mbar reactor pressure using an In/Ga molar flow ratio of 0.11, a N/V ratio of 0.97, and a III/V ratio of 0.0028, followed by the 2.25 μm thick GaAs layer using a III/V ratio of 0.074, also at 520° C. and 100 mbar. The precursors for In, Ga, As, and N were trimethylindium, trimethylgallium, tertiarybutylarsine, and 1,1-dimethylhydrazine, respectively. The InGaP layer, described in the substrate reuse experiment, was deposited at 520° C. and 100 mbar using an In/Ga molar flow ratio of 0.42, a III/V ratio of 0.058, using tertiarybutylphosphine as the phosphorus precursor. For the as-grown TEM sample, the GaAs film cross-section was milled from a sample of the structure comprised of: <001>GaAs substrate/InGaAsN (190 nm)/GaAs (2.25 μm). For the post-liftoff GaAs film TEM sample, a piece of the aforementioned heterostructure was adhered to a Si substrate along the GaAs film surface with Crystal-Bond™ adhesive, and was then irradiated through the GaAs substrate with a single laser pulse of fluence 1195 mJ/cm$^2$, thereby transferring the GaAs film to the Si substrate. A cross section of this transferred GaAs film was then ion-milled from the Si substrate.

The invention claimed is:

1. A method for removing device layers from a substrate, the method comprising:
    providing a substrate having a substrate composition;
    disposing a sacrificial layer on the substrate;
    disposing one or more semiconductor device layers on the sacrificial layer to create a multilayer stack;
    wherein the sacrificial layer has a dissimilar composition relative to the substrate and relative to the semiconductor device layers;
    patterning the semiconductor device layers to partially or completely define a release perimeter;
    disposing a solid member adhered to the semiconductor device layers;
    providing one or more pulses of laser radiation to the multilayer stack, wherein absorption of the pulses of laser radiation in the sacrificial layer provides ablative release of the semiconductor device layers from the substrate, and wherein the pulses of laser energy are selectively absorbed by the sacrificial layer relative to the substrate and the semiconductor device layers;
    completely removing the sacrificial layer;
    whereby a released part of the semiconductor layers is separated from the substrate and adhered to the solid member.

2. The method of claim 1, wherein a single pulse of the laser radiation is used to provide the ablative release of the semiconductor device layers from the substrate.

3. The method of claim 1, wherein the substrate comprises gallium arsenide and the sacrificial layer comprises a composition including one or more of In, Ga, As, and N, wherein the composition has a band gap less than 1.43 eV and has a lattice constant of about 565 pm.

4. The method of claim 1, wherein the pulses of laser radiation have a fluence between about 100 mJ/cm$^2$ and about 6 J/cm$^2$.

5. The method of claim 1, wherein the pulses of laser radiation have a duration between about 0.1 nanosecond and about 1 microsecond.

6. The method of claim 1, wherein a thickness of the sacrificial layer is between about 1 nm and about 1 μm.

7. The method of claim 1, wherein the semiconductor device layers comprise one or more layers having the substrate composition.

8. The method of claim 1, wherein the device layers comprise a clean-up layer disposed adjacent to the sacrificial layer, and further comprising removing the clean-up layer after the ablative release of the semiconductor device layers from the substrate.

9. The method of claim 1, wherein the substrate comprises a clean-up layer disposed beneath the sacrificial layer, and further comprising removing the clean-up layer after the ablative release of the semiconductor device layers from the substrate.

10. The method of claim 1, wherein the sacrificial layer is disposed on a top surface of the substrate, wherein the substrate comprises a clean-up layer disposed on a bottom surface of the substrate opposite the top surface, and further comprising removing the clean-up layer after the ablative release of the semiconductor device layers from the substrate.

11. The method of claim 1, wherein the patterning the semiconductor device layers is performed via laser ablation.

12. The method of claim 1, wherein the patterning the semiconductor device layers is performed via wet etching or dry etching.

13. The method of claim 1, wherein the substrate comprises indium phosphide and the sacrificial layer comprises a composition including one or more of In, Ga, As, and N, wherein the composition has a lattice constant of about 587 pm.

14. A method for removing device layers from a substrate, the method comprising:
    providing a substrate having a substrate composition;
    disposing a sacrificial layer on the substrate;
    disposing one or more semiconductor device layers on the sacrificial layer to create a multilayer stack;
    patterning the semiconductor device layers to partially or completely define a release perimeter;
    disposing a solid member adhered to the semiconductor device layers;
    providing one or more pulses of laser radiation to the multilayer stack, wherein absorption of the pulses of laser radiation in the sacrificial layer provides ablative release of the semiconductor device layers from the substrate, and wherein the pulses of laser energy are selectively absorbed by the sacrificial layer relative to the substrate and/or the semiconductor device layers;

whereby a released part of the semiconductor layers is separated from the substrate and adhered to the solid member;

wherein the substrate comprises gallium arsenide and the sacrificial layer comprises a composition including one or more of In, Ga, As, and N, wherein the composition has a band gap less than 1.43 eV and has a lattice constant of about 565 pm.

15. A method for removing device layers from a substrate, the method comprising:

providing a substrate having a substrate composition;

disposing a sacrificial layer on the substrate;

disposing one or more semiconductor device layers on the sacrificial layer to create a multilayer stack;

patterning the semiconductor device layers to partially or completely define a release perimeter;

disposing a solid member adhered to the semiconductor device layers;

providing one or more pulses of laser radiation to the multilayer stack, wherein absorption of the pulses of laser radiation in the sacrificial layer provides ablative release of the semiconductor device layers from the substrate, and wherein the pulses of laser energy are selectively absorbed by the sacrificial layer relative to the substrate and/or the semiconductor device layers;

whereby a released part of the semiconductor layers is separated from the substrate and adhered to the solid member;

wherein the substrate comprises indium phosphide and the sacrificial layer comprises a composition including one or more of In, Ga, As, and N, wherein the composition has a lattice constant of about 587 pm.

* * * * *